(12) United States Patent
Fowler

(10) Patent No.: US 10,497,521 B1
(45) Date of Patent: Dec. 3, 2019

(54) ROLLER ELECTRIC CONTACT

(71) Applicant: XEROX CORPORATION, Norwalk, CT (US)

(72) Inventor: Jeffrey M. Fowler, Rochester, NY (US)

(73) Assignee: XEROX CORPORATION, Norwalk, CT (US)

(*) Notice: Subject to any disclaimer, the term of this patent is extended or adjusted under 35 U.S.C. 154(b) by 0 days.

(21) Appl. No.: 16/173,600

(22) Filed: Oct. 29, 2018

(51) Int. Cl.
| H01H 1/16 | (2006.01) |
| G03G 15/08 | (2006.01) |
| G11C 11/50 | (2006.01) |
| H01H 1/58 | (2006.01) |
| H01H 1/24 | (2006.01) |
| H01H 1/00 | (2006.01) |

(52) U.S. Cl.
CPC ............ *H01H 1/16* (2013.01); *G03G 15/0863* (2013.01); *G11C 11/50* (2013.01); *H01H 1/245* (2013.01); *H01H 1/5805* (2013.01); *G03G 2221/1823* (2013.01); *H01H 2001/001* (2013.01)

(58) Field of Classification Search
CPC ........ H01H 1/16; H01H 1/245; H01H 1/5805; H01H 2001/001; G11C 11/50; G03G 15/0863; G03G 2221/1823
See application file for complete search history.

(56) References Cited

U.S. PATENT DOCUMENTS

| 3,590,270 | A | * | 6/1971 | Weber | ...................... | H01H 1/16 307/119 |
| 4,149,049 | A | * | 4/1979 | Long | ........................ | H01H 1/16 200/277 |
| 4,943,224 | A | * | 7/1990 | Nied | ...................... | B29C 33/085 264/175 |
| 6,055,180 | A | | 4/2000 | Gudesen et al. | | |
| 6,606,261 | B2 | | 8/2003 | Gudesen et al. | | |
| 6,714,028 | B2 | * | 3/2004 | Garcia | ...................... | G01R 1/02 324/750.24 |
| 6,787,825 | B1 | | 9/2004 | Gudesen et al. | | |
| 6,788,563 | B2 | | 9/2004 | Thompson et al. | | |
| 6,804,138 | B2 | | 10/2004 | Thompson et al. | | |
| 6,878,980 | B2 | | 4/2005 | Gudesen et al. | | |

(Continued)

OTHER PUBLICATIONS

Author Unknown, "Fujipoly Zebra Elastomeric Connectors" product data sheet, date unknown, 24 pages.

(Continued)

*Primary Examiner* — G. M. A Hyder
(74) *Attorney, Agent, or Firm* — MH2 Technology Law Group LLP

(57) ABSTRACT

A roller electric contact comprises a roller comprising a shaft and a plurality of conductive discs electrically separated by an insulating material. The shaft extends through a rotational axis of the roller. A housing comprises slots in which the shaft of the roller is positioned, the slots configured to direct a non-rotational movement of the roller. A plurality of leaf springs are disposed in the housing. The leaf springs comprise an electrically conductive material. The plurality of conductive discs are spaced on the roller so that at least one of the conductive discs contact each of the plurality of leaf springs. A plurality of conductive wires extend from the roller electric contact, each of the plurality of conductive wires making electrical contact with one of the leaf springs.

20 Claims, 11 Drawing Sheets

(56) References Cited

U.S. PATENT DOCUMENTS

| | | | |
|---|---|---|---|
| 6,937,500 | B2 | 8/2005 | Gudesen et al. |
| 6,950,330 | B2 | 9/2005 | Thompson et al. |
| 6,982,895 | B2 | 1/2006 | Broms et al. |
| 7,193,881 | B2 | 3/2007 | Womack et al. |
| 7,839,138 | B2 * | 11/2010 | Garcia ............... G01R 1/06716 324/750.3 |

OTHER PUBLICATIONS

Author Unknown, "GB-Matrix-type of Inter-Connector—Shin-Etsu Polymer Europe B.V.," product data sheet, downloaded Oct. 26, 2018, https://shinetsu.info/gb-matrix-type_of_inter-connector, 3 pages.

Author Uknown, "Bourns 70AB/Male Modular Contact," product data sheet, Rev. 11/17, dowloaded Oct. 26, 2018, 3 pages.

Author Unknown, "Molex 47507 Series connectors," product data sheet, downloaded Oct. 26, 2018, https://www.digikey.com/catalog/en/partgroup/47507-series/50952, 1 page.

Author Unknown, "Shin-Etsu Polymer Europe B.V.—GB-E-type of Inter-Connector," product data sheet, downloaded Oct. 26, 2018, https://www.shinetsu.info/gb-e-type_of_inter-connector, 3 pages.

Author Unknown "TE Connectivity Connectors," product data sheet, downloaded Oct. 26, 2018, https://www.te.com/global-en/product-2199035-2.html, 3 pages.

Author Unknown, "Shin-Etsu Polymer Europe B.V.—GB-U-type of Inter-Connector," product data sheet, downloaded Oct. 26, 2018, https://www.shinetsu.info/gb-u-type_of_inter-connector, 3 pages.

Author Unknown, "AVX Parallel/Stacking—Ultra Low Profile Stacker: 00-9258," product data sheet, downloaded Oct. 26, 2018, http://www.avx.com/products/connectors/board-to-board/ultra-low-profile-stacker-00-9258.

Author Unknown, "Samtec SIB Connectors," product data sheet, downloaded Oct. 26, 2018, https://www.samtec.com/products/sib, 8 pages.

Author Unknown, "Shin-Etsu Polymer Europe B.V.—S-type of Inter-Connector," product sheet, downloaded Oct. 26, 2018, https://www.shinetsu.info/s-type_of_inter-connector, 3 pages.

Author Unknown, "Shin-Etsu Polymer Europe B.V.—AF-type of Inter-Connector," product sheet, downloaded Oct. 26, 2018, https://www.shinetsu.info/af-type_of_inter-connector, 3 pages.

Author Unknown, "Bourns Modular Contacts—70AB Male," downloaded Oct. 26, 2018, https://bourns.com/products/connectors/modular-contacts/product/70AB-Male, 1 page.

* cited by examiner

ROLLER ELECTRIC CONTACT

DETAILED DESCRIPTION

Field of the Disclosure

The present disclosure is directed to a roller electric contact, an apparatus for employing the roller electric contact and a method of contacting electronic devices using the roller electric contact.

BACKGROUND

There are various types of conventional mechanisms for temporarily making electrical contact with electronic devices. One example of such a mechanism is a leaf spring contact, which allows an electronic device to be slid into place in a position where a conductive leaf spring provides spring loading force that allows good contact with the contact pads of the electronic device. However, these types of leaf spring mechanisms can cause damage due to the friction of the leaf spring rubbing against the electronic device as the device is positioned in physical contact therewith.

Other types of contact mechanisms involve contact through a wheel, such as is disclosed in U.S. Pat. No. 6,040,705. However, such mechanisms are complicated and costly. Further, due to their complexity, such wheel contact mechanisms are not easily designed for making contact to very small electronic devices.

Accordingly, novel contacts that can address one or more of the problems of the prior art mechanism would be a welcome advancement in the art.

SUMMARY

An embodiment of the present disclosure is directed to a roller electric contact. The roller electric contact comprises a roller comprising a shaft and a plurality of conductive discs electrically separated by an insulating material, the shaft extending through a rotational axis of the roller. A housing comprises slots in which the shaft of the roller is positioned, the slots configured to direct a non-rotational movement of the roller. A plurality of leaf springs are disposed in the housing. The leaf springs comprise an electrically conductive material. The plurality of conductive discs are spaced on the roller so that at least one of the conductive discs contact each of the plurality of leaf springs. A plurality of conductive wires extend from the roller electric contact, each of the plurality of conductive wires making electrical contact with one of the leaf springs.

Another embodiment of the present disclosure is directed to an apparatus. The apparatus comprises a receptacle for receiving a customer replaceable unit and a circuit board adjacent to the receptacle. The circuit board comprises a first roller electric contact. The first roller electric contact comprises a roller comprising a shaft and a plurality of conductive discs electrically separated by an insulating material, the shaft extending through a rotational axis of the roller. A housing comprises slots in which the shaft of the roller is positioned, the slots configured to direct a non-rotational movement of the roller. A plurality of leaf springs are disposed in the housing, the leaf springs comprising an electrically conductive material. The plurality of conductive discs are spaced on the roller so that at least one of the conductive discs contact each of the plurality of leaf springs. A plurality of conductive wires extend from the first roller electric contact, each of the plurality of conductive wires establishing an electrical contact between one of the leaf springs and the circuit board.

Still another embodiment of the present disclosure is directed to a method for contacting an electronic memory device on a customer replaceable unit. The method comprises providing an apparatus comprising (i) a receptacle for receiving the customer replaceable unit: and (ii) a circuit board adjacent to the receptacle. The circuit board comprises one or more electronic components for processing data from an electronic memory device and a roller electric contact comprising a plurality of conductive discs. The method includes inserting a customer replaceable unit comprising the electronic memory device attached thereto into the receptacle so that one or more of the plurality of conductive discs roll into contact with one or more contact pads of the electronic memory device. In this manner, the electronic memory device makes contact with the circuit board.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

Figure 1:
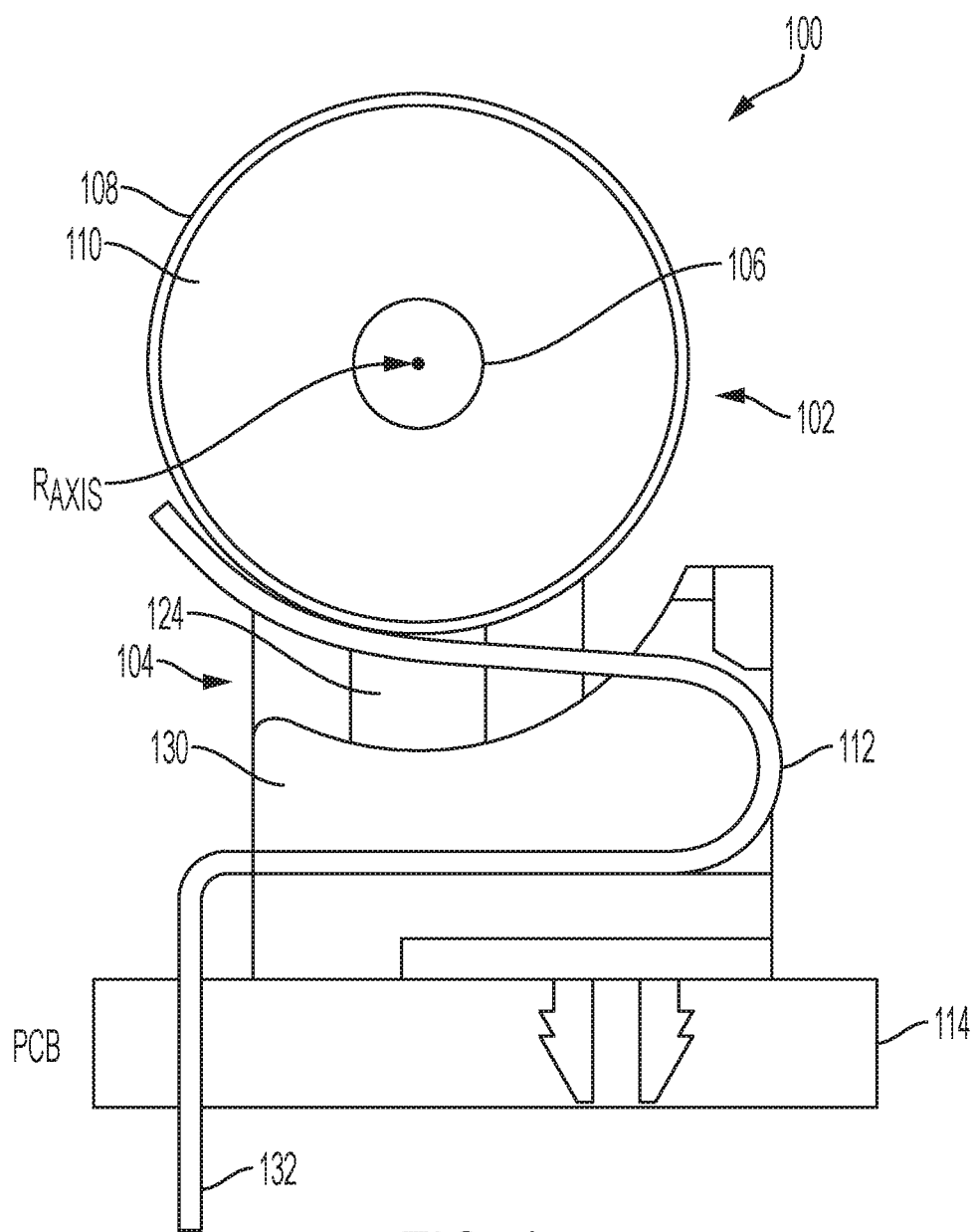
FIG. 1 illustrates a schematic, cross-sectional view of a roller electric contact, according to an embodiment of the present disclosure.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

Unless otherwise indicated, the terms insulating, insulative, insulate, conducting, conductive, conduct, and other related words are used herein in their electrical sense (e.g., meaning "electrically insulating" or "electrically conducting"), as opposed to other possible meanings, such as those related to heat or sound.

FIGS. 1 to 4 illustrate various views of a roller electric contact 100, according to an embodiment of the present disclosure. The roller electric contact 100 comprises a roller 102 disposed in a housing 104. The roller 102 comprises a shaft 106 and a plurality of conductive discs 108 electrically separated by an insulating material 110. A plurality of leaf springs 112 comprising an electrically conductive material are also disposed in the housing 104. The leaf springs 112 are electrically connected to a circuit board 114. The roller electrical contact 100 can conduct electricity from the conductive discs 108 through the leaf spring 112 to make contact between the circuit board 114 and a contact pad 120 (FIG. 2) of an electronic device, such as a printed circuit. In this way, roller electrical contact 100 functions as an electrical contact for the circuit board 114.

The shaft 106 extends through a rotational axis of the roller 102 and can comprise any suitable rigid material. Examples of suitable materials can include metals, such as steel, or a rigid plastic, such as acetal or other polymers. If the shaft 106 is conductive, it is electrically insulated form the plurality of conductive discs 108.

The plurality of conductive discs 108 are spaced on the roller 102 so that at least one of the conductive discs 108 can electronically contact each of the plurality of leaf springs 112. As examples, one, two, three or more conductive discs 108 can contact each leaf spring 112. The conductive discs 108 can optionally protrude from the insulating material 110 to enhance electrical contact with the leaf springs 112 and/or contact pads 120.

Figure 5:
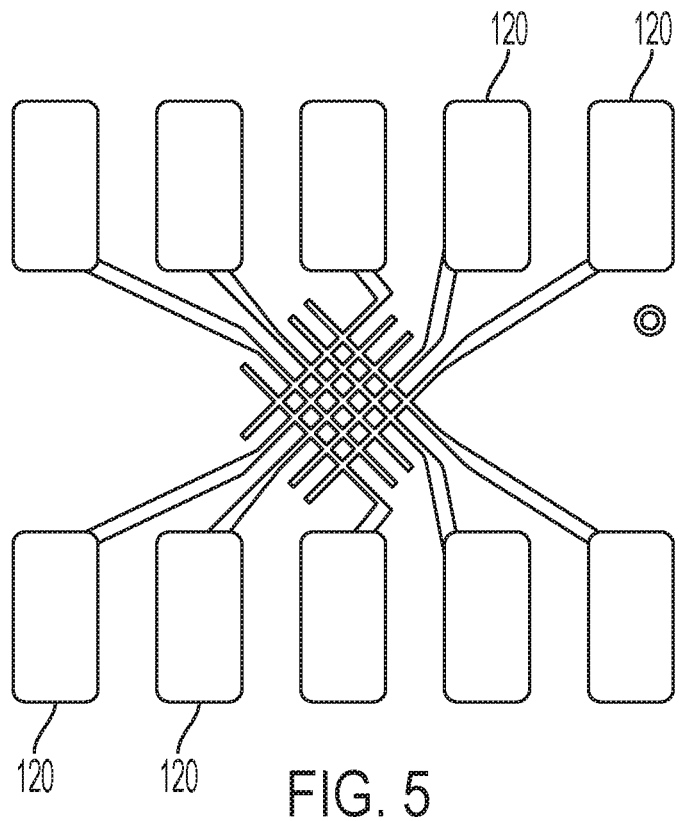
FIG. 5 illustrates a top view of an electronic memory device.
Figure 6:
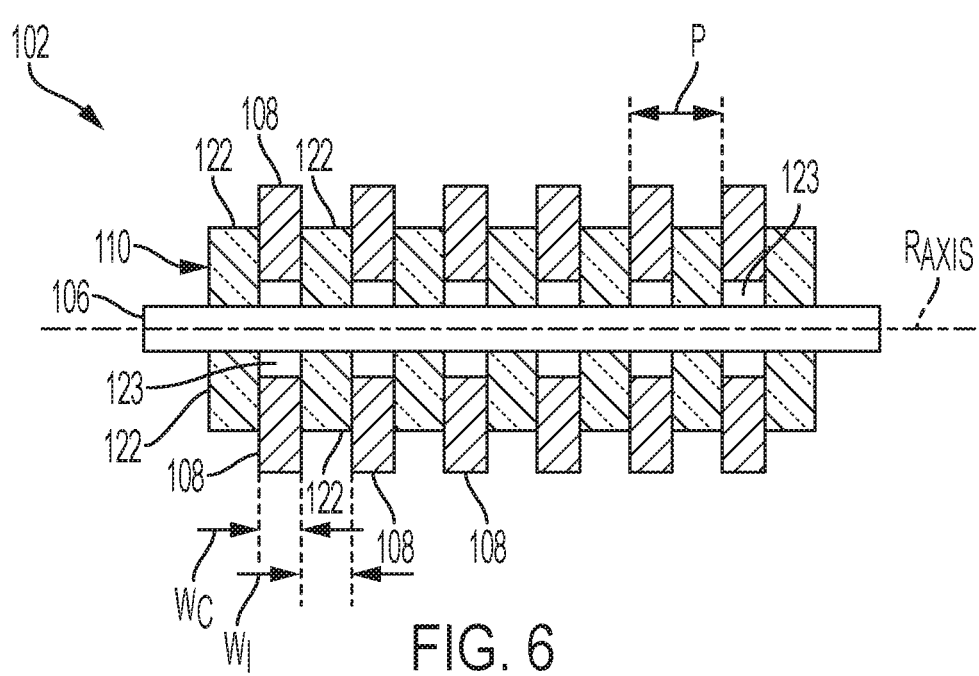
FIG. 6 illustrates a schematic cross-sectional view of a roller, according to an embodiment of the present disclosure.
Figure 11:
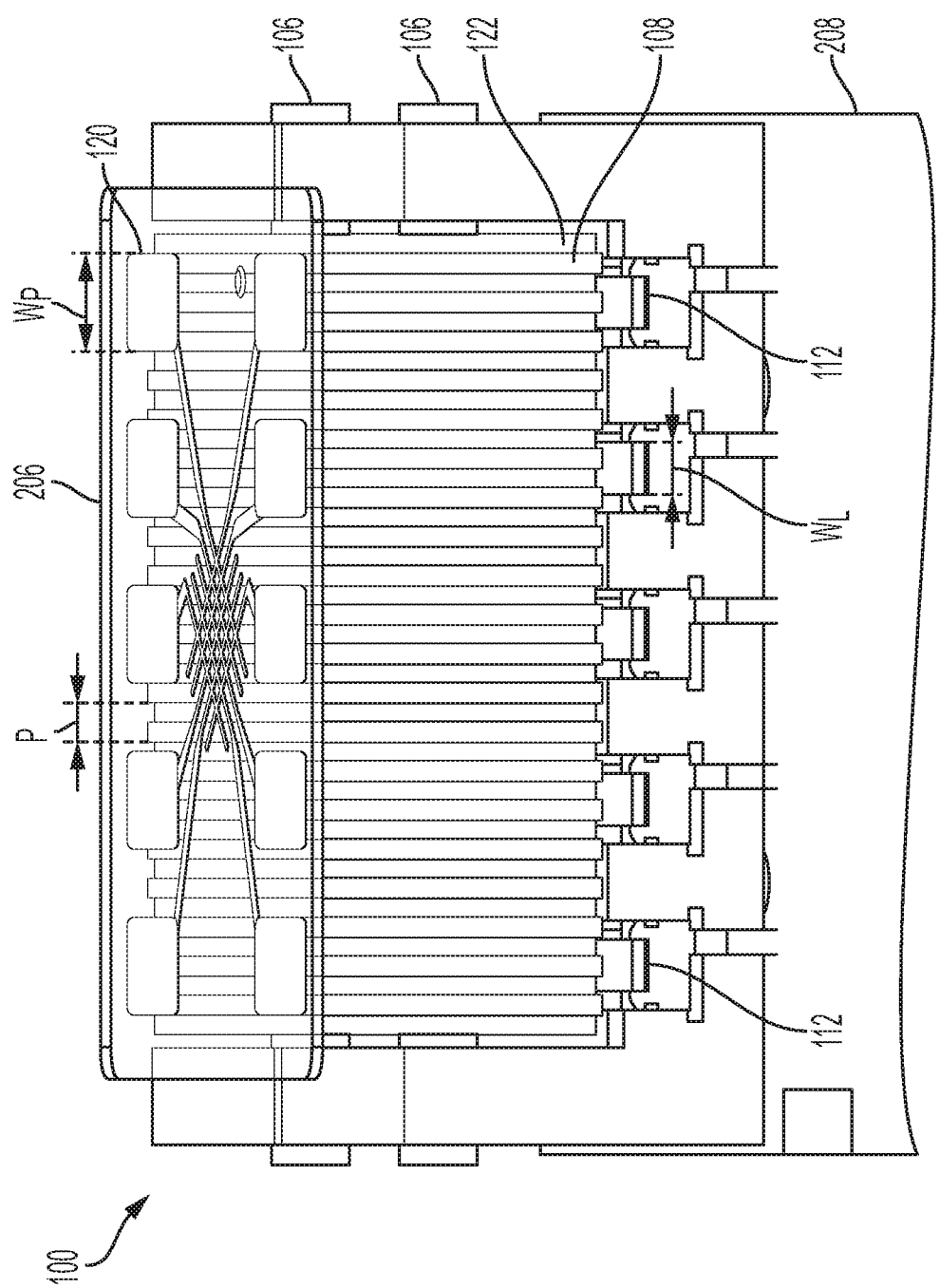
FIG. 11 illustrates a schematic close-up perspective view of a portion of a circuit board on which two roller electric contacts are contacting an electronic memory device, according to an embodiment of the present disclosure.

The pitch, P, of the conductive discs, which refers to the distance in the direction of the $R_{axis}$ of the roller 102 separating analogous features of adjacent discs 108, is determined by the width, $W_c$, of the conductive discs and spacing, $W_I$, therebetween, as illustrated in FIG. 6. The pitch can be chosen to provide ease of contact with relatively small contact pads and/or to allow for relatively narrow spacing between the contact pads 120. In many electronic devices, such as the conventional printed memory of FIG. 5, a plurality of contact pads 120 can be arranged together in a very small space, which can make it difficult to align with each contact pad separately in order to provide reliable contact to the devices. By adjusting the pitch of the conductive discs 108, the design of the roller electric contact 100 can allow for contact with relatively closely spaced contact pads. As is more clearly illustrated in FIG. 11, by choosing a pitch, "p", for the conductive discs 108 that is smaller than both the width, $W_p$, of the contact pads 120 and the width, $W_L$, of leaf springs 112, horizontal alignment between the conductive discs 108 with the contact pads 120 of an electronic device becomes easier. Example dimensions for the pitch can range from about 0.01 mm to about 1 mm, such as about 0.02 mm to about 0.5 mm, or about 0.05 mm to about 0.3 mm. Example dimensions for $W_c$ can range from about 0.01 mm to about 1 mm, or about 0.02 mm to about 0.5 mm, or about 0.03 mm to about 0.2 mm. Example dimensions for the $W_I$ can range from about 0.01 mm to about 1 mm, or about 0.02 mm to about 0.5 mm, or about 0.02 mm to about 0.2 mm.

The conductive discs 108 are electrically insulated from adjacent conductive discs 108 and the shaft 106. The insulating material 110 may cover the shaft 106 and have conductive discs 108 embedded therein so that the plurality of conducting discs 108 protrude from the surface of, and extend substantially around the circumference of, the roller 102. Other conductors, such as wires (not shown) can also be embedded in the insulating material 110.

In an embodiment, the insulating material 110 comprises an elastomer. Examples of suitable elastomers include silicone, TPU (thermoplastic polyurethane), EPDM (ethylene propylene diene monomer) rubbers and mixtures of any two or more of these elastomers.

In an embodiment, the insulating material 110 of the roller is in a form of a plurality of insulating discs 122 positioned between the conductive discs 108. FIG. 6 illustrates a cross-sectional view of one such embodiment in which the conductive discs 108 are supported by the insulating discs 122 comprising an elastomer. The durometer of the elastomer is chosen to provide relative compliance between neighboring conductive discs 108, thereby allowing the conductive discs to adjust position relative to each other to account for variations in the topology of the surfaces being contacted. For example, insulating discs 122 comprising an elastomer may be stacked (laminated) between the conductive discs 108 in such a way that the insulating material 110 is positioned primarily between the conductive discs 108, and does not extend the entire length of the axis of the roller (e.g., does not extend under the conductive discs 108), so that the conducting discs are suspended between insulating discs 122. Conducting shaft 106 does not contact any of the plurality of the conducting discs 108. In an embodiment, gaps 123 are disposed between the conductive discs 108 and shaft 106. The gaps can be filled with any insulating material, such as air (e.g., an airgap), another gas or a vacuum, or an insulating polymer. In an embodiment, gaps 123 can be filled with the same or a different insulating material as insulating discs 122. Alternatively, if shaft 106 is insulative, any plurality of the conducting discs 108 can contact the insulating shaft 106.

Figure 7:
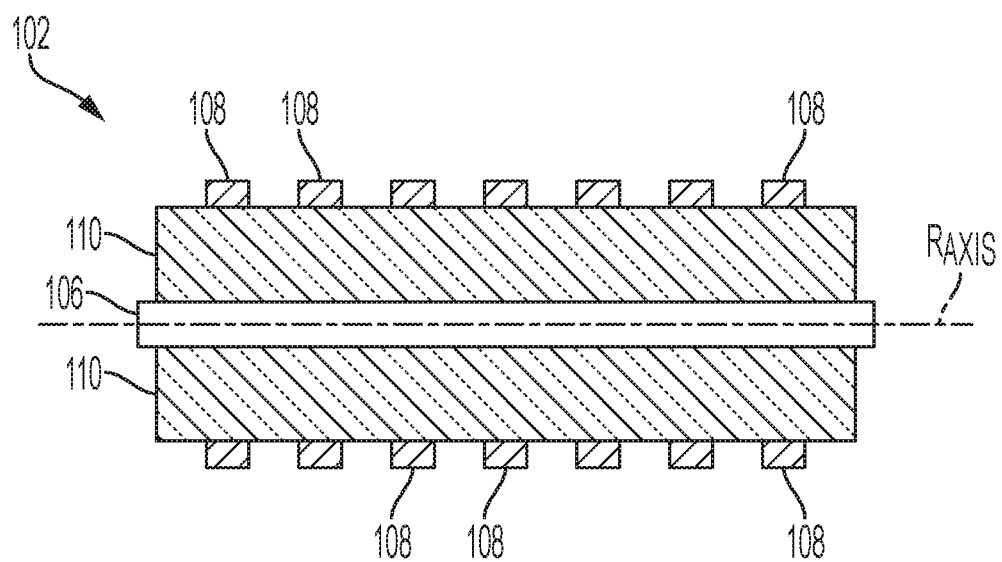
FIG. 7 illustrates a schematic cross-sectional view of a roller, according to an embodiment of the present disclosure.

FIG. 7 illustrates cross-sectional view of another embodiment of roller 102. An insulating material 110 is disposed in a layer surrounding shaft 106, where shaft 106 can be either conductive or insulative. Conductive discs 108 are disposed on the insulating material 110. Techniques suitable for forming the insulating material 110 in a layer on shaft 106 and for forming the conductive discs 108 are well known in the art.

In general, the roller 102 may be formed as in integral part of the shaft 106. Alternatively, the shaft 106 may be manufactured separately from the insulating material 110 and conductive discs 108 of the roller 102 and then incorporated into the roller 102. The roller and/or shaft can be manufactured by any suitable method, such as by over-molding techniques or by punching rollers from laminate sheets. Such methods are generally well known in the art.

Figure 8:
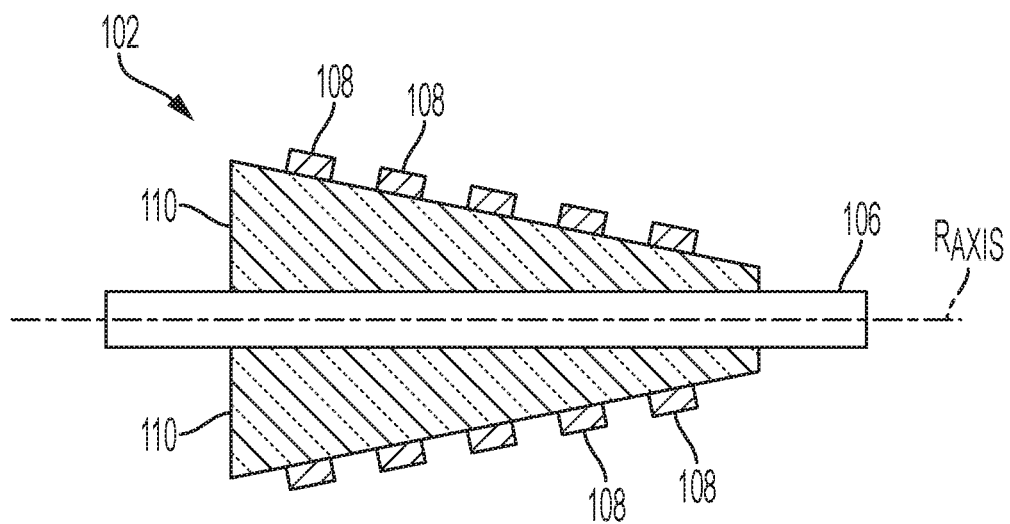
FIG. 8 illustrates a schematic cross-sectional view of a conical roller, according to an embodiment of the present disclosure.

Specialized applications may specify some conicity of the roller 102, so that the roller 102 rolls in a circular arc rather than a straight line. A schematic view of an example of a conical roller 102 is shown in FIG. 8.

Referring again to FIGS. 1 and 3, the housing 104 can be made of any suitable material, such as plastic. Any suitable plastic that has the desired rigidity and that can otherwise support the roller can be employed. An example of such a plastic is polyoxymethylene, sometimes referred to herein as "acetal".

The housing 104 comprises slots 124 in which the ends of the shaft 106 of roller 102 are positioned. The slots 124 are configured to direct non-rotational movement of the roller 102, such as a lateral or up-and-down motion, while allowing the shaft 106 to freely rotate on a rotational axis, $R_{axis}$, of the roller. In FIG. 1, the $R_{axis}$ is shown as a dot in the center of shaft 106 going into the page, and is more clearly shown as a dashed line in FIG. 6. The roller 102 is moveable in the slots 124 from a first position, shown in FIGS. 1 and 3, in which the leaf springs 112 are extended as compared to a second position, shown in FIGS. 2 and 4, in which the leaf springs 112 are compressed by the roller 102.

Figure 2:
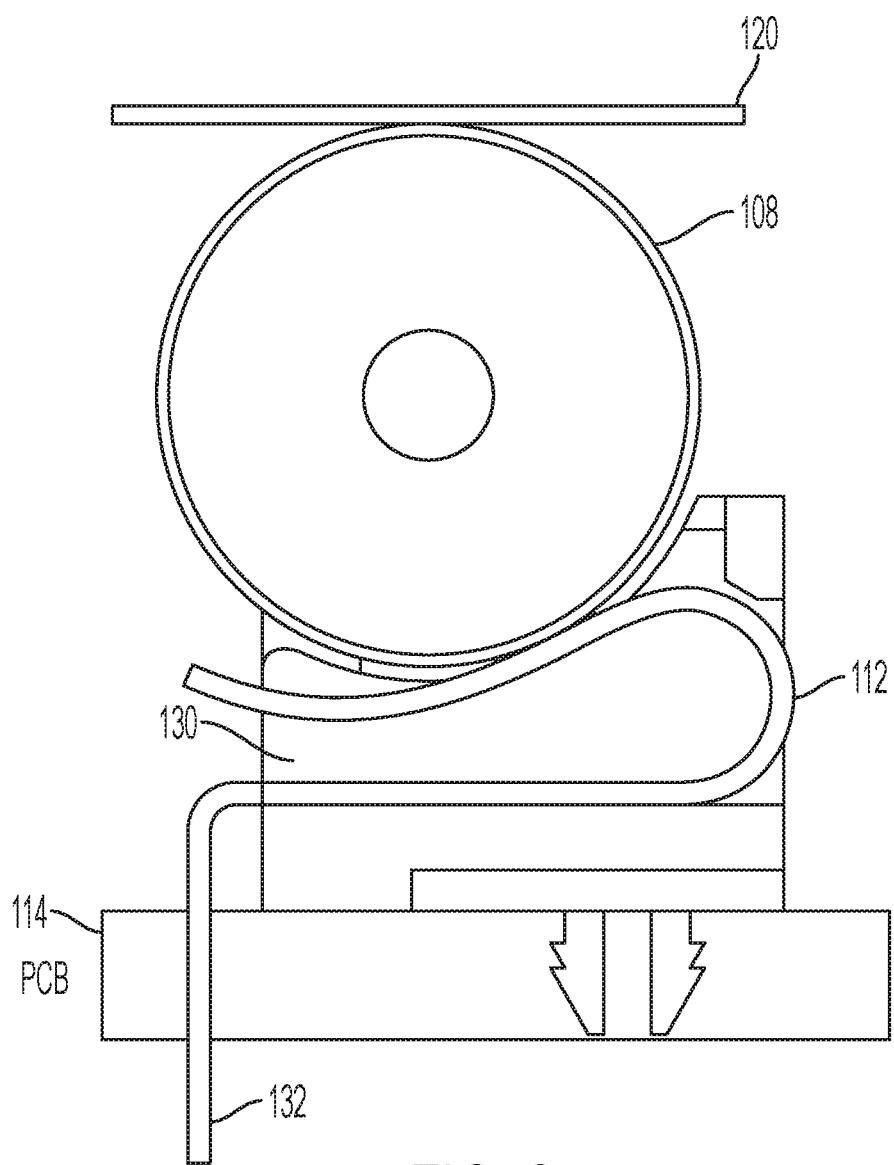
FIG. 2 illustrates a schematic, cross-sectional view of the roller electric contact of FIG. 1 contacting a contact pad, according to an embodiment of the present disclosure.
Figure 3:
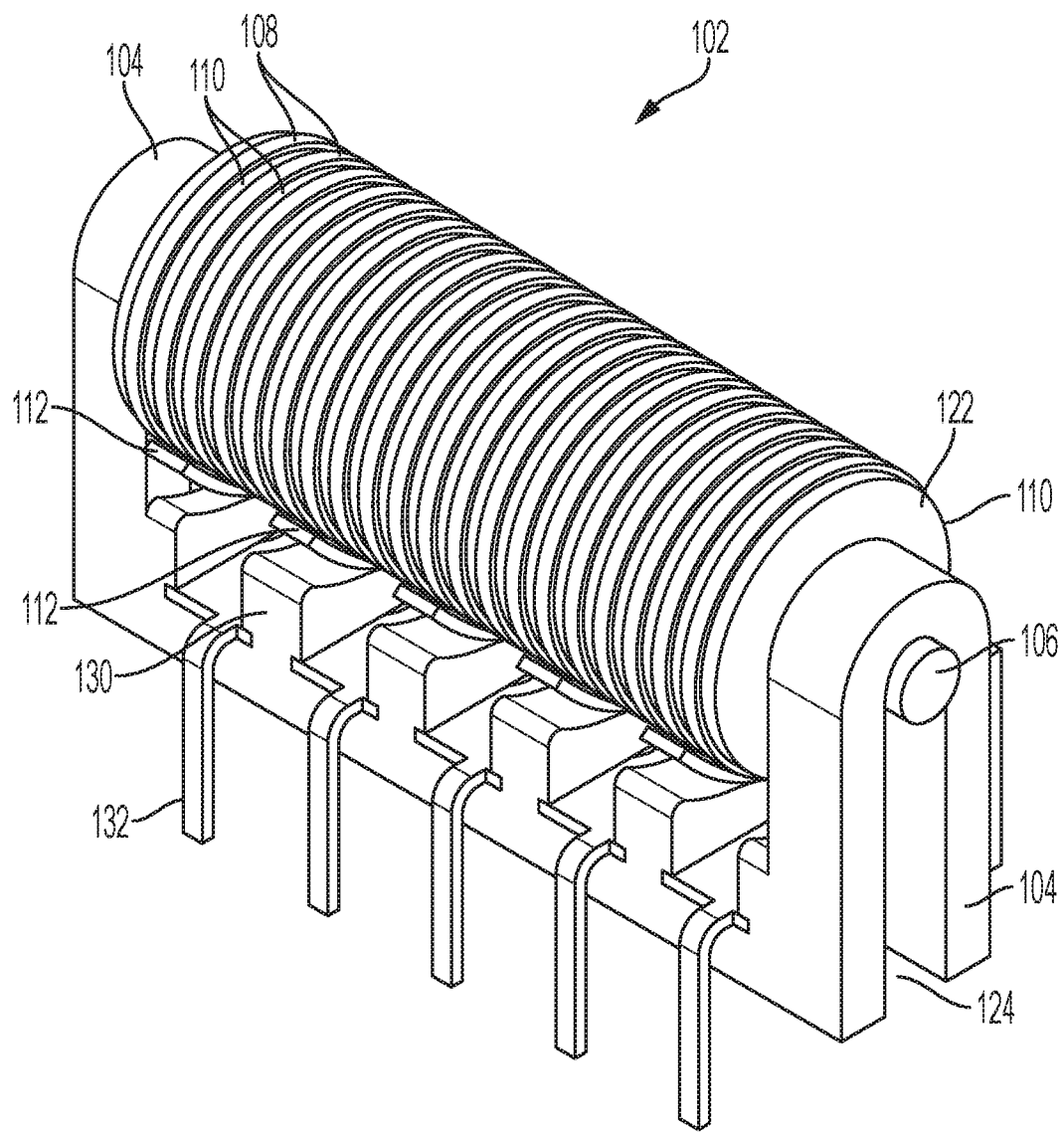
FIG. 3 illustrates a perspective view of a roller electric contact, according to an embodiment of the present disclosure.
Figure 4:
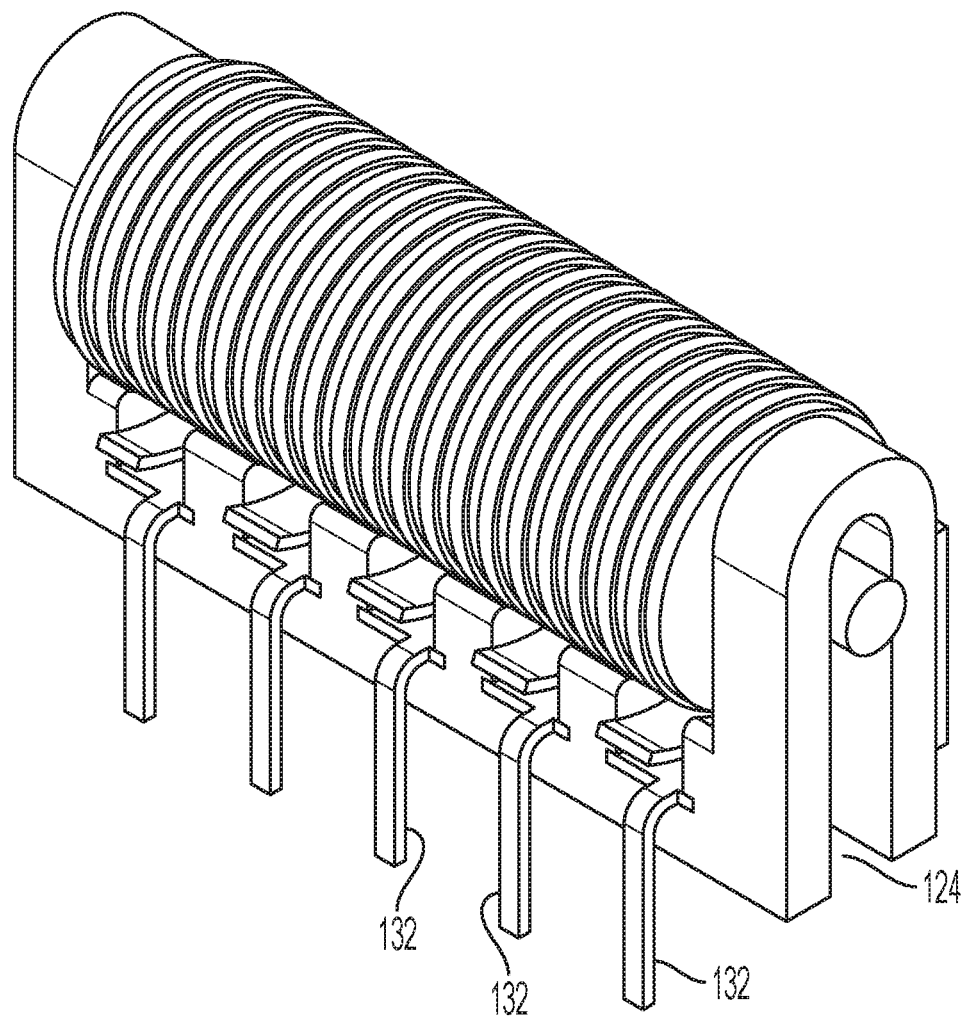
FIG. 4 illustrates a perspective view of a roller electric contact, according to an embodiment of the present disclosure.

A cradle 130 is positioned in the housing 104 so as to stop the non-rotational movement of the roller 102 at the second position, as shown in FIGS. 2 and 4. Employing a cradle 130 in this fashion can reduce or prevent over compression of, and potential damage to, the leaf springs 112.

A plurality of conductive wires 132 extend from the roller electric contact 100. Each of the plurality of conductive wires 132 is electrically connected with one of the leaf springs 112. In an embodiment, each of the plurality of conductive wires 132 can be formed as a single, integral part with one of the leaf springs 112. Alternatively, the conductive wires 132 can be formed separate from the leaf springs 112 and electrically connected thereto.

The leaf springs 112 and conductive wires 132 can comprise any suitable conductive material. Examples of suitable material for the leaf springs 112 include spring steel, gold, silver, or other metals. In an example, the leaf springs 112 may be plated. For example, the leaf springs 112 may comprise a gold or silver plated elastic material, such as spring steel, in order to provide the desired elasticity and conductivity. The conductive wires 132 can be made from the same material, or a different material, as the leaf springs 112.

An electrically conductive carbon brush coating can optionally be employed between the roller 102 and leaf springs 112 to reduce and/or prevent wear caused by friction of the roller 102 on the leaf springs 112. For example, the carbon brush can potentially mitigate the effects of wear so that any wear that does occur will not impede the proper function of the connector over its anticipated design life. In an embodiment, the brush coating can comprise a block of plastic impregnated with carbon. Any suitable carbon brush can be employed. Examples of suitable carbon brushes are well known in the art, such as have been employed in commutators of some electric motors.

An example method for constructing the roller electric contacts 100 of the present disclosure includes laminating many alternating conducting and insulating layers into a sheet approximately as thick as the intended length of the roller 102, punching hollow cylinders out of the laminate with an outer diameter equal to the roller outer diameter and an inner diameter equal to the shaft 106 diameter. The hollow cylinders can then be placed in an injection-molded housing 104 and a shaft 106 is then press-fit into the inner diameter of the cylinder, thus capturing the roller in the housing 104. Leaf springs 112 can be press-fit into the housing or frame. This method could employ an insulating shaft 106 (or a conducting shaft 106 coated with an insulating material). Preferably the process would be controlled so as to cause the insulating discs to retract relative to the conducting discs 108 after punching. Controlling temperature and/or compression during the punching process may help with this, or possibly a post-punching anneal step such as curing or heat treatment.

Figure 9:
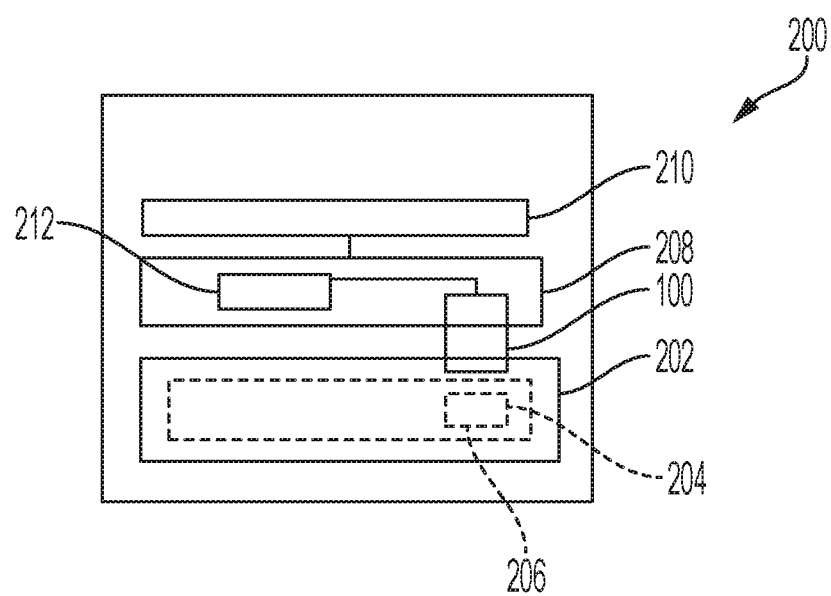
FIG. 9 illustrates a block diagram of an apparatus, according to an embodiment of the present disclosure

FIG. 9 illustrates a block diagram of an apparatus 200, according to an embodiment of the present disclosure. The apparatus 200 comprises a receptacle 202 for receiving a customer replaceable unit 204. The customer replaceable unit can include an electronic memory device 206, such as a printed memory, with data that is designed to be read by the apparatus 200. The customer replaceable unit 204 is illustrated in FIG. 9 using dashed lines to indicate that it is a device that is separable from the apparatus 200 and is designed to be easily installed and/or removed by an operator of the apparatus 200. A circuit board 208 is disposed adjacent to the receptacle 202. Circuit board 208 comprises at least one roller electric contact 100, as described herein. The at least one roller electric contact 100 can be employed to establish an electrical connection between the circuit board 208 and the electronic memory 206 on the customer replaceable unit 204, when the customer replaceable unit 204 is inserted into the receptacle 202. In addition to the at least one roller electric contact 100, circuit board 208 can further include any number and type of electronic components 212 that may be useful for the operation of the apparatus 200. For example, circuit board 208 can include one or more electronic components 212 for processing data from electronic memory device 206.

Figure 10:
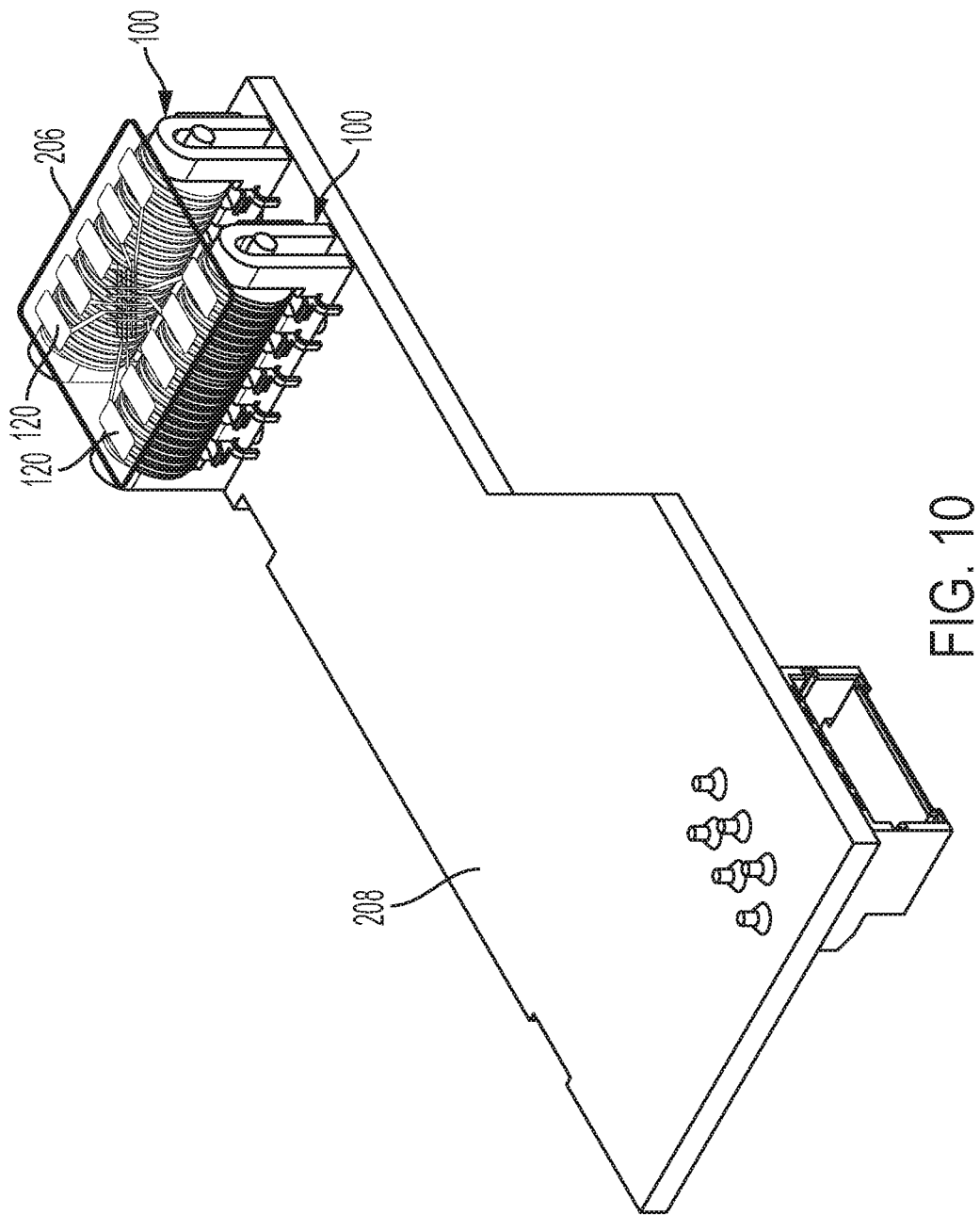
FIG. 10 illustrates a schematic perspective view of a circuit board on which two roller electric contacts are contacting an electronic memory device, according to an embodiment of the present disclosure.

Any number of roller electric contacts can be employed on the circuit board 208, depending on, for example, the number and configuration of contacts to be made. FIG. 10 illustrates a circuit board 208 that comprises two electric contacts 100. The roller electric contacts 100 are positioned adjacent to each other on circuit board 208 so as to make contact with two rows of contact pads 120 on electronic memory device 206. Thus, 2, 3, 4 or more roller electric contacts 100 can be employed on a circuit board.

Referring back to FIG. 9, apparatus 200 can be any type of apparatus that would benefit from the roller electric contacts 100 of the present disclosure. In an embodiment, apparatus 200 is a printing device (e.g., a laser printer) and the receptacle 202 is configured to receive a toner cartridge as the customer replaceable unit 204. In another embodiment, the apparatus 200 is a printing device (e.g., an inkjet printer or other printer that employs ink) and the receptacle 202 is configured to receive an ink cartridge as the customer replaceable unit 204. In yet another embodiment, the apparatus 200 is a refrigerator and the receptacle 202 is configured to receive a water filter as the customer replaceable unit 204. In still another embodiment, the apparatus 200 is a beverage dispenser for dispensing coffee or other beverages and the receptacle 202 is configured to receive a beverage container (e.g., a cup) as the customer replaceable unit 204. Other types of apparatus that would benefit from the use of roller electric contacts of the present disclosure can be determined by one of ordinary skill in the art.

In certain applications the orientation of the customer replaceable unit 204 bearing the electronic memory device 206 may not be easily controlled, such as for example, in the case of a cup or other beverage container being inserted into a beverage dispenser. In such cases, an optional orientation mechanism 210 can physically couple the circuit board 208 to the apparatus 200, as shown in FIG. 9. The orientation mechanism 210 is configured to rotate or otherwise orient the circuit board 208 and/or customer replaceable unit 204 relative to each other such that the roller electric contacts 100 are positioned in possible locations of the electronic memory device 206 on the customer replaceable unit 204, thereby allowing the one or more roller electric contacts 100 to make electrical contact with the electronic memory device 206. FIG. 9 illustrates the orientation mechanism attached to the circuit board 208. In addition to, or in place of, the orientation mechanism 210 being attached to the circuit board 208, an orientation mechanism can be attached to rotate or otherwise orient the customer replaceable unit 204. Orientation mechanisms are generally well known in the art and determining and/or designing a suitable orientation mechanism for a given type of apparatus 200 would be within the ordinary skill of the art.

Figure 12:
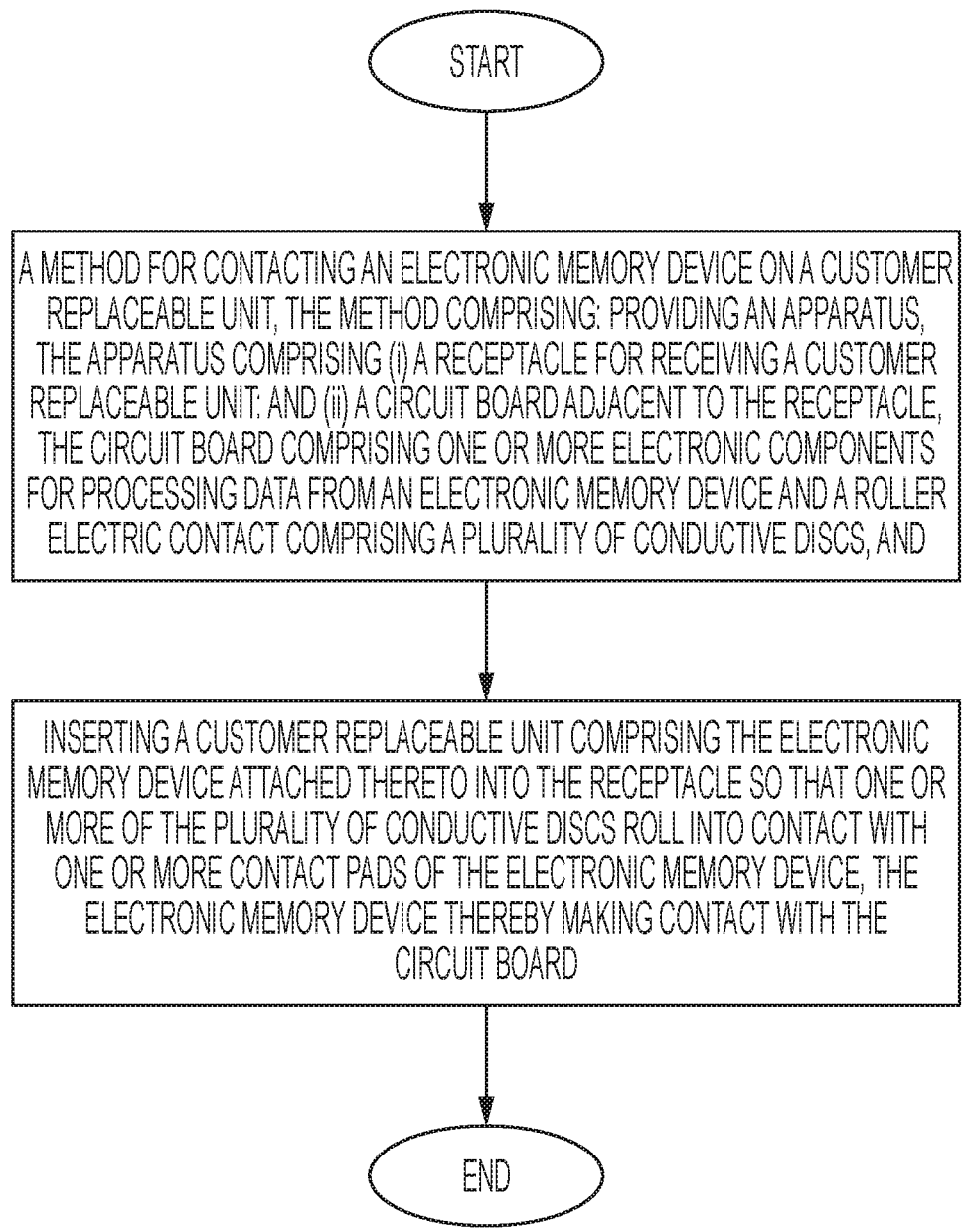
FIG. 12 illustrates a flow diagram of a method for contacting an electronic memory device using a roller electric contact, according to an embodiment of the present disclosure

FIG. 12 illustrates a flow diagram of a method for contacting an electronic memory device 206 on a customer replaceable unit 204, according to an embodiment of the present disclosure. The method comprises providing an apparatus, such as, for example, the apparatus 200 described above with respect to FIG. 9. The apparatus includes (i) a receptacle 202 for receiving the customer replaceable unit 204: and (ii) a circuit board 208 adjacent to the receptacle 202. The circuit board 208 can include, for example, one or more electronic components 212 for processing data from an electronic memory device 206 and a roller electric contact 100 comprising a plurality of conductive discs 108, such as any of the roller electric contacts disclosed herein. The method further comprises inserting a customer replaceable unit 204 comprising the electronic memory device 206 attached thereto into the receptacle 202 so that one or more of the plurality of conductive discs 108 roll into contact with one or more contact pads 120 of the electronic memory device 206. The electronic memory device 206 thereby makes contact with the circuit board 208.

Employing the roller electric contacts 100 of the present disclosure to make contact with contact pads 120 can reduce friction, and thereby reduce wear, between the electric contacts 100 and the contact pads. Electronic memory devices 206, such as printed memory, can sometimes employ relatively soft contact pads 120, such as carbon pads. Such soft contact pads may be vulnerable to damage from friction type contacts, such as conventional leaf spring contacts. By providing a rolling contact with the printed memory, damage to contact pads can be reduced or avoided compared to the damage caused by traditional leaf spring contacts that do not employ a rolling mechanism.

Figure 13:
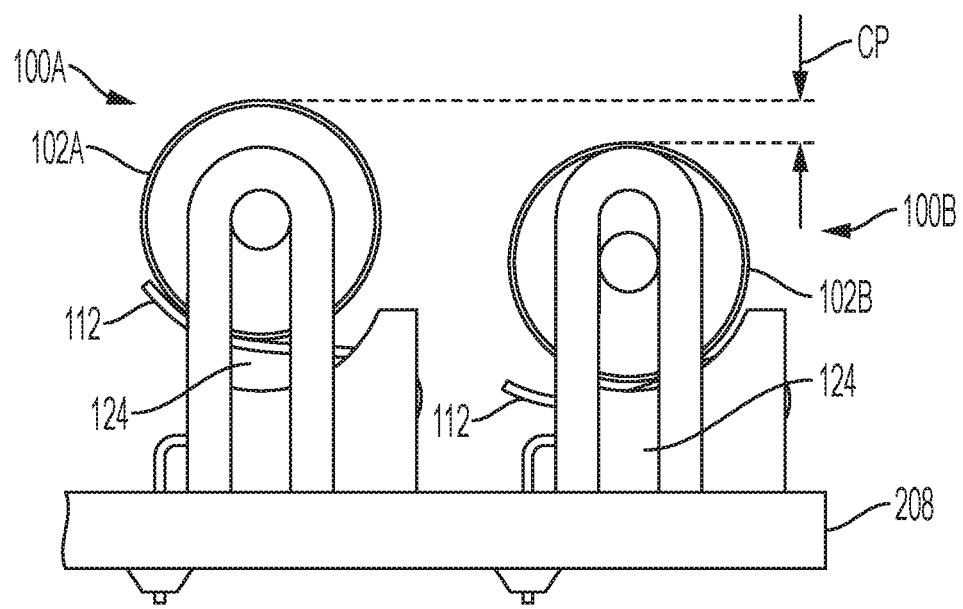
FIG. 13 illustrates a schematic side view of a portion of a circuit board on which two roller electric contacts are disposed, according to an embodiment of the present disclosure.

FIG. 13 illustrates two identical roller electric contacts 100A and 100B positioned on a circuit board 208. A degree of compliance, CP, is provided by the ability of roller 102 to move in the slot 124 from a first position, shown by roller 102A of roller electric contact 100A, in which the leaf springs 112 are extended as compared to a second position, shown by roller 102B of roller electric contact 100B, in which the leaf springs 112 are compressed. Thus, the degree of compliance provided is the difference in height of the roller 102 between the first position and the second position. The compliance provided by this movement allows electrical contact to be made to contact pads at varying distances from the circuit board 208 that are within the zone of compliance, CP.

The methods of the present disclosure can be employed with any of the apparatuses and associated customer replaceable units, as described herein. The phrase "printing device" as used herein encompasses any apparatus, such as a digital copier, bookmaking machine, facsimile machine, multi-function machine, laser printer, inkjet printer and the like, which employs a customer replaceable unit and performs a print outputting function for any purpose.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A roller electric contact, comprising:
   a roller comprising a shaft and a plurality of conductive discs electrically separated by an insulating material, the shaft extending through a rotational axis of the roller;
   a housing comprising slots in which the shaft of the roller is positioned, the slots configured to direct a non-rotational movement of the roller; and
   a plurality of leaf springs disposed in the housing, the leaf springs comprising an electrically conductive material, the plurality of conductive discs being spaced on the roller so that at least one of the conductive discs contact each of the plurality of leaf springs; and
   a plurality of conductive wires extending from the roller electric contact, each of the plurality of conductive wires making electrical contact with one of the leaf springs.

2. The roller electric contact of claim 1, wherein the roller is moveable in the slots from a first position at which the leaf springs are extended relative to a second position at which the leaf springs are compressed by the roller.

3. The roller electric contact of claim 2, further comprising a cradle disposed to stop a motion of the roller at the second position.

4. The roller electric contact of claim 1, wherein the insulating material is in a form of a plurality of insulating discs.

5. The roller electric contact of claim 1, wherein the insulating material comprises an elastomer.

6. The roller electric contact of claim 1, wherein each of the plurality of conductive wires forms a single, integral part with one of the leaf springs.

7. An apparatus, comprising:
a receptacle for receiving a customer replaceable unit: and
a circuit board adjacent to the receptacle, the circuit board comprising a first roller electric contact, the first roller electric contact comprising:
a roller comprising a shaft and a plurality of conductive discs electrically separated by an insulating material, the shaft extending through a rotational axis of the roller;
a housing comprising slots in which the shaft of the roller is positioned, the slots configured to direct a non-rotational movement of the roller; and
a plurality of leaf springs disposed in the housing, the leaf springs comprising an electrically conductive material, the plurality of conductive discs being spaced on the roller so that at least one of the conductive discs contact each of the plurality of leaf springs; and
a plurality of conductive wires extending from the first roller electric contact, each of the plurality of conductive wires establishing an electrical contact between one of the leaf springs and the circuit board.

8. The apparatus of claim 7, wherein the circuit board further comprises a second roller electric contact adjacent to the first roller electric contact.

9. The apparatus of claim 7, wherein the apparatus is a printing device and the receptacle is configured to receive a toner cartridge.

10. The apparatus of claim 7, wherein the apparatus is a printing device and the receptacle is configured to receive an ink cartridge.

11. The apparatus of claim 7, wherein the apparatus is a refrigerator and the receptacle is configured to receive a water filter.

12. The apparatus of claim 7, wherein the roller is moveable in the slots from a first position at which the leaf springs are extended relative to a second position at which the leaf springs are compressed by the roller.

13. The apparatus of claim 7, wherein the insulating material is in a form of a plurality of insulating discs.

14. The apparatus of claim 7, wherein the insulating material comprises an elastomer.

15. The apparatus of claim 7, wherein each of the plurality of conductive wires forms a single, integral part with one of the leaf springs.

16. A method for contacting an electronic memory device on a customer replaceable unit, the method comprising:
providing an apparatus comprising (i) a receptacle for receiving the customer replaceable unit: and (ii) a circuit board adjacent to the receptacle, the circuit board comprising one or more electronic components for processing data from an electronic memory device and a roller electric contact comprising a plurality of conductive discs, and
inserting a customer replaceable unit comprising the electronic memory device attached thereto into the receptacle so that one or more of the plurality of conductive discs roll into contact with one or more contact pads of the electronic memory device, the electronic memory device thereby making contact with the circuit board.

17. The method of claim 16, wherein the apparatus is a printing device and the customer replaceable unit is a toner cartridge.

18. The method of claim 16, wherein the apparatus is a printing device and the customer replaceable unit is an ink cartridge.

19. The method of claim 16, wherein the apparatus is a refrigerator and the customer replaceable unit is a water filter.

20. The method of claim 16, wherein the roller electric contact comprises:
a roller comprising a shaft and the plurality of conductive discs electrically separated by an insulating material, the shaft extending through a rotational axis of the roller;
a housing comprising slots in which the shaft of the roller is positioned, the slots configured to direct a non-rotational movement of the roller; and
a plurality of leaf springs disposed in the housing, the leaf springs comprising an electrically conductive material, the plurality of conductive discs being spaced on the roller so that at least one of the conductive discs contact each of the plurality of leaf springs; and
a plurality of conductive wires extending from the roller electric contact, each of the plurality of conductive wires establishing an electrical contact between one of the leaf springs and the circuit board.

* * * * *